United States Patent
Hongo et al.

(10) Patent No.: US 7,811,910 B2
(45) Date of Patent: Oct. 12, 2010

(54) MANUFACTURING METHOD OF DISPLAY DEVICE

(75) Inventors: Mikio Hongo, Yokohama (JP); Akio Yazaki, Yokohama (JP); Takahiro Kamo, Tokyo (JP)

(73) Assignee: Hitachi Displays, Ltd., Chiba (JP)

( * ) Notice: Subject to any disclaimer, the term of this patent is extended or adjusted under 35 U.S.C. 154(b) by 299 days.

(21) Appl. No.: 12/043,159

(22) Filed: Mar. 6, 2008

(65) Prior Publication Data
US 2008/0227274 A1    Sep. 18, 2008

(30) Foreign Application Priority Data
Mar. 7, 2007    (JP) .............................. 2007-056826

(51) Int. Cl.
*H01L 21/268*    (2006.01)
(52) U.S. Cl. .............................. 438/487; 257/E21.347; 257/E21.475; 438/486; 438/488
(58) Field of Classification Search .......... 257/E21.347, 257/E21.475; 438/486, 487, 488
See application file for complete search history.

(56) References Cited

U.S. PATENT DOCUMENTS

| | | | | |
|---|---|---|---|---|
| 6,943,086 B2 * | 9/2005 | Hongo et al. | ............... | 438/308 |
| 7,026,227 B2 * | 4/2006 | Tanaka | ....................... | 438/487 |
| 7,087,504 B2 * | 8/2006 | Nakajima et al. | ........... | 438/486 |
| 7,132,375 B2 * | 11/2006 | Yamazaki | .................... | 438/795 |
| 7,183,148 B2 * | 2/2007 | Yazaki et al. | ................ | 438/166 |
| 2003/0068836 A1 * | 4/2003 | Hongo et al. | ................. | 438/30 |

FOREIGN PATENT DOCUMENTS

| | | |
|---|---|---|
| JP | 2-6093 | 1/1990 |
| JP | 10-258381 | 9/1998 |
| JP | 2003-124136 | 4/2003 |

* cited by examiner

*Primary Examiner*—Asok K Sarkar
(74) *Attorney, Agent, or Firm*—Antonelli, Terry, Stout & Kraus, LLP.

(57) ABSTRACT

In crystallization of a silicon film by annealing using a linear-shaped laser beam having a width of the short axis of the beam is ununiform, the profile (intensity distribution) of the laser beam is evaluated and the results are fed back to a condition of oscillating the laser beam or an optical condition for projecting the laser beam onto the silicon film, whereby a display device comprising a high-quality crystalline silicon film is manufactured. The energy distribution of the linear-shaped laser beam is determined by a detector type CCD camera which is moved stepwise in the directions in which its long axis and short axis extend, respectively, and a value obtained by dividing an accumulated intensity E in the long axis direction obtained by accumulating the detected signal in the direction parallel to the short axis by the square root of the width W of the short axis of the above linear-shaped laser beam in each position of the long axis: $E/\sqrt{(W)}$, is determined in all the positions of a cross section of the linear-shaped laser beam to evaluate the above intensity distribution.

11 Claims, 7 Drawing Sheets

Scanning Direction of Leaser

Power Density: $P_0$

Width of Short Axis: $W_0$

Width of Short Axis: $W_t$

Power Density: $P_t$ $P_0$

MANUFACTURING METHOD OF DISPLAY DEVICE

The present application claims priority from Japanese application JP2007-056826 filed on Mar. 7, 2007, the content of which is hereby incorporated by reference into this application.

BACKGROUND OF THE INVENTION

1. Field of the Invention

The present invention relates to a display panel, and in particular, to a manufacturing method of a display device using an insulating substrate with active elements formed in a strip-shaped poly-crystalline semiconductor film, obtained by reforming an amorphous or granular poly-crystalline semiconductor film formed on the main surface of the insulating substrate so as to expand crystal grains into a substantially strip shape by use of annealing with laser light (also referred to merely as laser hereinafter) irradiated thereto. The case where silicon is used as a semiconductor will be described below.

2. Description of the Related Art

In current display devices such as liquid crystal and organic electroluminescence display units, an image is formed by switching pixel transistors (thin film transistors: TFT) consisting of an amorphous or poly-crystalline silicon film on a substrate of glass, fused quartz or the like with an insulating film interposed therebetween. The substrate on which pixel circuits are formed is referred to as an active matrix substrate, TFT substrate, or is simply referred to as an active panel. If it becomes possible to form the driver circuit for driving the thin-film transistors of the pixel circuits concurrently with the formation of the thin-film transistors, drastic reduction in production cost and enhancement in reliability can be expected. However, when an amorphous silicon is used as a silicon semiconductor film constituting active layers of the transistors (thin film transistors) constituting the driver circuit, the performance of the thin film transistors, typically including mobility, is low. Thus, it is difficult to manufacture a circuit for which high speed and high function are required, from an amorphous silicon.

In order to manufacture such high-speed and high-function circuits, a high-mobility thin film transistor is required. To realize this, it is necessary to improve the crystallinity of the silicon thin film. As a method for improving the crystallinity, excimer laser annealing has been getting a lot of attention. According to this method, mobility is improved by irradiating an amorphous silicon film formed on an insulating substrate of glass or the like with an insulating film interposed therebetween with excimer laser so that the amorphous silicon thin film is transformed into a granular poly-crystalline silicon thin film. However, in the granular poly-crystalline silicon thin film obtained by irradiation of excimer laser, the particle size is about several tens to hundreds of nanometers. Thus, such a film is deficient in performance to be applied to a driver circuit or the like for driving pixel transistors in a display device.

As the prior art for overcoming this problem, "patent document 1" discloses a method of forming so-called strip-shaped crystals by linearly condensing temporally modulated continuous-wave (CW) laser light or quasi-continuous-wave laser light and by scanning and irradiating at a high speed in a direction which crosses (normally the direction which perpendicularly crosses) the longitudinal direction of the linear shape in the scanning direction to cause growth of crystals in the lateral direction (that is, scanning direction). According to this method, the entire surface of the substrate is poly-crystallized by the excimer laser annealing, and then only a region where driver circuits are formed is scanned by a laser beam in the direction which coincides with the current path (source-drain) of the formed transistors so that crystal grains are grown laterally. As a result, the mobility is greatly improved by the absence of crystal grain boundaries which traverse the current path or by reforming the crystal grains into minute crystals.

However, while high-output continuous-wave laser light or quasi-continuous-wave laser light is condensed by a transmission lens and irradiated, components of an objective lens absorb laser light, though to a small extent, and thus its temperature is increased. This temperature rise causes thermal expansion and a change in the index of refraction, and therefore the focal length of the lens is changed and the light-concentration ability of the lens is lowered. This change in the focal length or lowered light-concentration ability lowers the energy density on the surface of the substrate, resulting in a situation where energy for forming a strip-shaped poly-crystalline thin film is insufficient. Consequently, the quality and yield of the flat display device are lowered. Patent document 2 and patent document 3, among others, are known as methods for dealing with such changes in the focal position caused by this thermal lens effect.

Patent document 2 discloses a laser processing apparatus in which a spacer constituted of an expansion component which expand and shrink in response to a conductive heat from a condenser lens is provided in an upper part of a condenser lens, and the condenser lens is pressed downwardly towards a workpiece (the component to be processed) by the expansion component in response to its conductive heat in a state that the condenser lens is thrusted from the bottom to the top with a ring having a spring characteristic, so that the focal position is maintained at an optimum value by offsetting by the upward shift of the focal position by the thermal lens effect.

Patent document 3 discloses an apparatus in which a temperature in each point of a condenser lens is measured by a far-infrared radiant temperature sensor; the measurement is input into a computer having thermal analyzer software determined in advance to calculate the thermal deformation amount of the lens; the amount of a change in the focal length is calculated from the thermal deformation amount; and the position of the lens is moved depending on the results by using a pulse motor to control in such a manner that a focus is always on a workpiece material.

[Patent document 1]
Japanese Unexamined Patent Application Publication No. 2003-124136
[Patent document 2]
Japanese Unexamined Patent Application Publication No. H10-258381
[Patent document 3]
Japanese Unexamined Patent Application Publication No. H2-6093

SUMMARY OF THE INVENTION

The present invention is to improve the prior art mentioned above. That is, the method described in patent document 1 has the problems that the focal length of the lens is changed by the thermal lens effect of the objective lens and the influence of the lowered light-concentration ability of the lens is not considered and therefore the yield of the panel is lowered.

The apparatus described in "patent document 2" utilizes expansion and shrinkage caused by the thermal conduction from a condenser lens, and the apparatus described in "patent document 3" measures a temperature to calculate a thermal deformation amount and a change in the focal length based on the measurement and moves the lens accordingly. Therefore, both apparatuses have the problems of poor time responsiveness and of the absence of a means for monitoring if a focus is actually accurate or not. Moreover, they cannot cope with the case where the light-concentration ability is lowered, unlike with a simple change in a focal length.

An object of the present invention is to provide a manufacturing method of a flat display device which can correct a decrease in light-concentration ability by the thermal lens effect of the objective lens, or a change in power density resulting from a change in a focal length, a change in the condensed state substantially thermal due to the lens effect by adjusting the output of irradiation, and can produce a flat display device at a high yield by performing appropriate annealing throughout the inside of the substrate.

To achieve the object mentioned above, the manufacturing method of a flat display device of the present invention determines the profile of laser light on the surface of the substrate. When the beam size of a focusing portion is changed by the thermal lens effect of the objective lens, an output incident on the objective lens is adjusted so that a temperature rise in a laser-irradiated portion on the surface of the substrate is constant, that is, a value obtained by multiplying a maximum power density on the surface of the substrate by the square root of the width of the short axis (width along the short axis) is constant. Accordingly, even if the thermal lens effect is generated in the objective lens, a strip-shaped poly-crystalline film having a constant quality can be obtained consistently.

According to the present invention, a strip-shaped poly-crystalline film having a constant quality can be obtained consistently, and therefore flat display devices can be manufactured at a high yield.

DETAILED DESCRIPTION

The best mode for carrying out the invention will be described in detail below with reference to the drawings.

Figure 1:
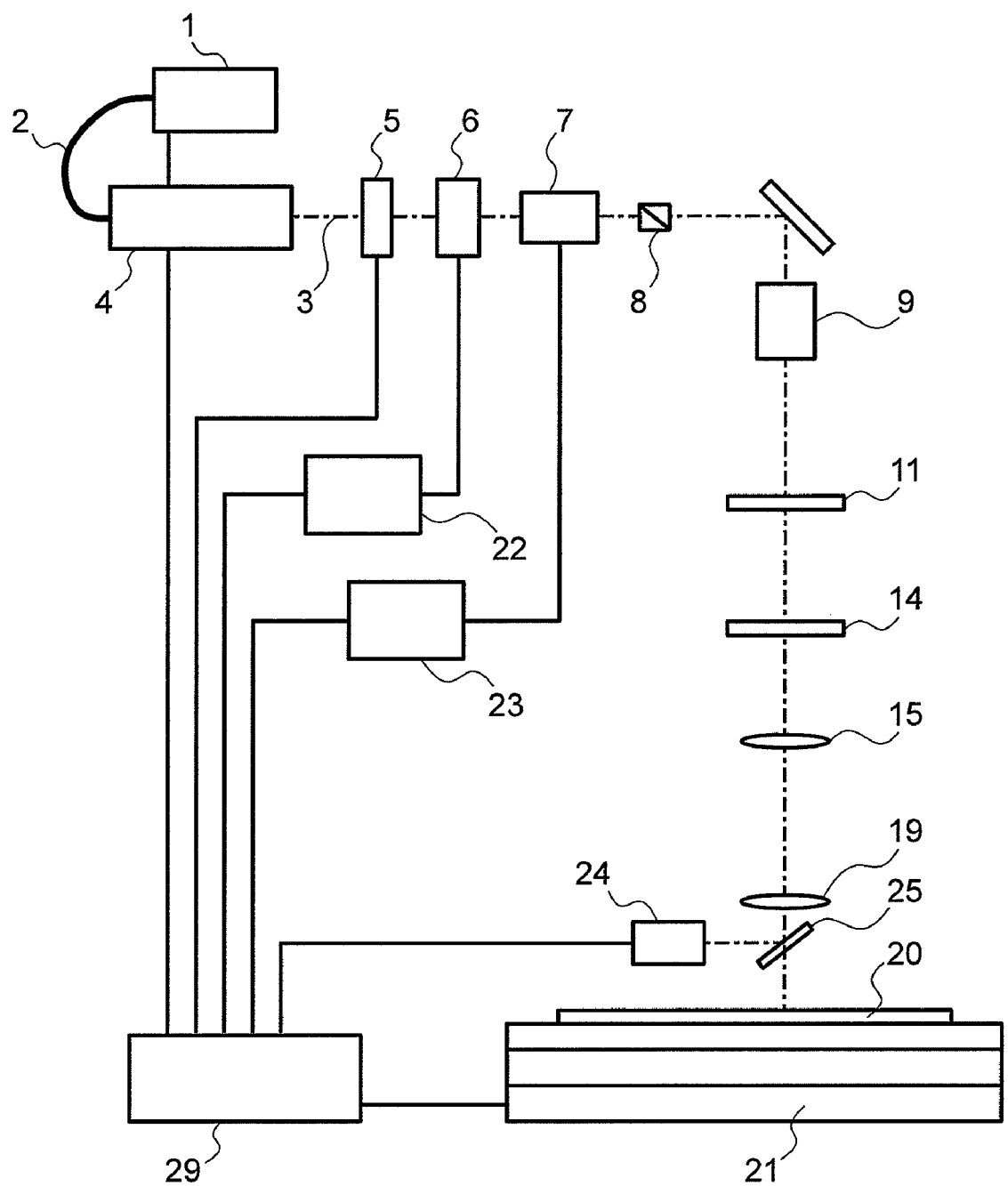
FIG. 1 is a drawing for showing the constitution of the manufacturing device of a flat display device suitable for carrying out the manufacturing method of a flat display device according to the present invention.
Figure 2:
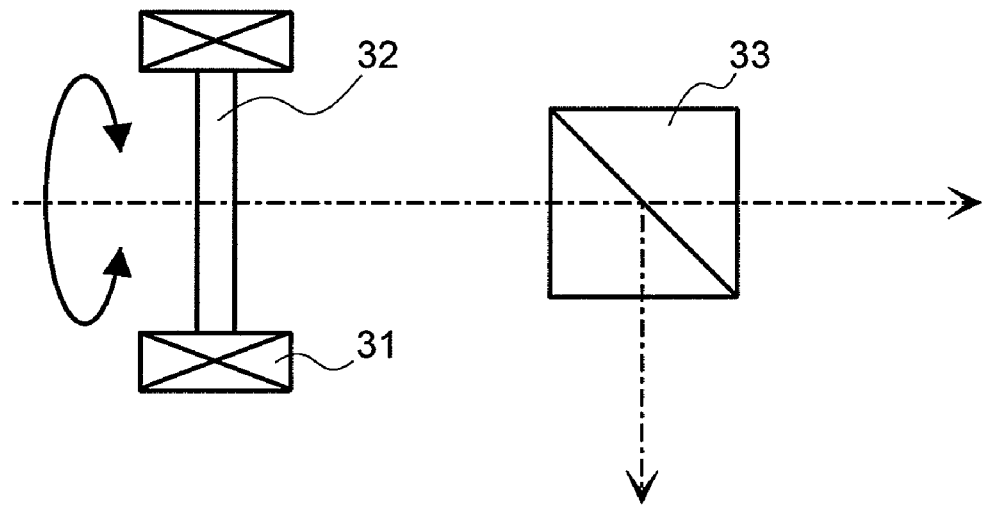
FIG. 2 is a drawing for showing the constitution of a continuously variable transmittance filter suitable for carrying out the manufacturing method of a flat display device according to the present invention.
Figure 3:
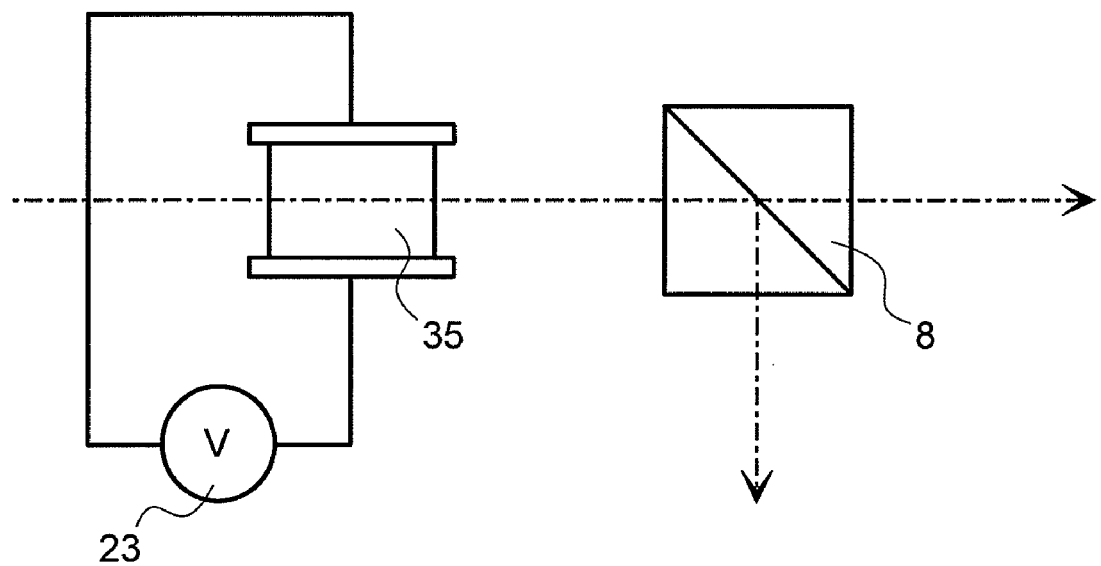
FIG. 3 is a drawing for showing the constitution of an EO modulator suitable for carrying out the manufacturing method of a flat display device according to the present invention.

FIG. 1 is a constitutional drawing of a manufacturing device suitable for carrying out the manufacturing method of a flat display device according to the present invention. FIG. 2 is a drawing for showing the constitution of a continuously variable transmittance filter suitable for carrying out the manufacturing method of a flat display device according to the present invention. FIG. 3 is a drawing for showing the constitution of an EO modulator (an electrooptical modulator) suitable for carrying out the manufacturing method of a flat display device according to the present invention.

This device comprises a laser oscillator 4 for generating continuous-wave laser light (hereinafter simply referred to as laser light) 3 coupled to a pumping LD (laser diode) 1 by an optical fiber 2, a shutter 5 for turning the laser light 3 ON/OFF, a continuously variable transmittance ND filter 6 for adjusting the energy of the laser light 3, a modulator 7 for pulsating the laser light 3 output from the laser oscillator 4 by amplitude modulation or for realizing temporal intensity (amplitude) modulation of energy, and a polarizing beam splitter 8.

The device also comprises a beam expander (or beam reducer) 9 for adjusting the beam diameter of the laser light 3, a beam shaper 11 for shaping the laser light 3 into a long and narrow shape, for example, linear, rectangular, elliptical and flat oval shape and, also having a flat-top energy distribution, a mask 14 for adjusting the longitudinal direction of the shaped laser light 3 to have a predetermined size, an imaging lens (tube lens) 15 for converting the image of the mask 14 into a collimated beam, and an objective lens 19 for reductively projecting the laser light which passes through the imaging lens 15 on the surface of a substrate 20 mounted on a stage 21.

In addition, the device comprises a beam profiler 24 for monitoring the condensed state by the objective lens 19, a ND filter driver 22 which controls the continuously variable transmittance ND filter 6, a modulator driver 23 for driving and controlling the modulator 7 and a control apparatus 29 for controlling the elements of the device.

Subsequently, the operation and functions of the components of the manufacturing device shown in FIG. 1 will be described in detail. The laser light 3 is emitted from the continuous wave (CW) laser oscillator 4 driven by the pumping laser diode 1. The laser beam 3 preferably has a wavelength that is absorbed by the amorphous or poly-crystalline silicon thin film which is to be processed by this manufacturing device, specifically a wavelength in the range from the ultraviolet to the visible wavelengths.

Described more specifically, the wavelength of this laser light is as follows: That is, usable wavelengths of the laser light used include Ar laser or Kr laser and its second harmonics, Nd: YAG laser, Nd: YVO$_4$ laser, Nd: second harmonics and third harmonics of YLF laser, semiconductor laser (including laser diode) of a visible wavelength and the like. Moreover, so-called quasi-continuous-wave (quasi-CW) laser, which is ultrashort pulse laser oscillation repeatedly performed in a high cycle, may be used as the laser oscillator although it is not a complete continuous-wave. Among these, considering the size and stability of the output, the second harmonics of LD (laser diode) pumped Nd:YAG laser (wavelength 532 nm) or the second harmonics of Nd:YVO$_4$ laser (wavelength 532 nm) is used most desirably. In the following description, the case where the second harmonics of LD pumped Nd:YVO$_4$ laser is used will be described.

The continuous-wave laser light 3 oscillated from the laser oscillator 4 is turned ON/OFF by the shutter 5. That is, the laser oscillator 4 always remains in a state of oscillating the laser light 3 with a constant output, and the laser light 3 is blocked by the shutter 5 normally in a closed state (OFF state). The substrate 20 is prevented from being irradiated with the laser light 3 by the shutter 5 during its transportation, alignment and others. Only when annealing is carried out or when alignment marks, if necessary, are formed, this shutter 5 is opened (rendered in the ON state), to output the laser light 3 to the substrate.

It is possible to turn the laser light 3 ON/OFF by switching the pumping laser diode 1 ON/OFF, but it is undesirable in terms of ensuring the stability of the laser output of the laser oscillator 4. Additionally, when it is wished to stop the irradiation of the laser light 3 urgently from the standpoint of safety, the shutter 5 may be also closed without stopping the laser oscillator 4. Accordingly, the output of the laser light 3 can be shut off without adversely affecting the oscillator itself.

The laser light 3 which passes through the shutter 5 while it is open transmits through the continuously variable transmittance ND filter 6 used for adjusting output and falls on the modulator 7. As the continuously variable transmittance ND filter 6, one in which the polarization direction is not rotated by the transmission of the laser light therethrough is desirably used. However, this does not apply when an AO modulator (an acoustooptical modulator), which is not influenced by the polarization direction, is employed as the modulator 7 as described later.

As an example of the continuously variable transmittance ND filter 6, as shown in FIG. 2, the combination of a ½ wave plate 32, which is rotatably placed by a rotary bearing 31 or the like so that the optical axis of the laser light is the rotational center, and a polarizing beam splitter 33 is used. It should be noted that in FIG. 2, a drive mechanism for conducting rotational driving is omitted, but a constitution which is driven by a pulse motor or a DC motor via a gear and a belt, or directly by a ultrasound wave motor, can be also employed.

When the laser light 3 is a linearly polarized light, adjustment is made so that the laser light which passes through the ½ wave plate 32 falls on the polarizing beam splitter 33 as a p-polarized light and all of the light is allowed to pass through. When the ½ wave plate 32 is rotated, via the driver 22, around the optical axis as its rotational center, the polarization direction of the laser light 3 which passes through the ½ wave plate 32 is rotated by twice the angle of the rotation angle of the ½ wave plate 32, and only a p-polarized light component is allowed to pass through the polarizing beam splitter 33 and an s-polarized light component is polarized 90 degrees, whereby the output of the laser light 3 passing therethrough is changed. That is, the rotation angle of the ½ wave plate 32 is rotated to any angle from 0 degree to 45 degrees, whereby a desired output setting can be obtained.

As the modulator 7 in FIG. 1, an EO (electrooptical) modulator is the most suitable. As shown in FIG. 3, the EO modulator applies a voltage to a Pockel's Cell (crystal) 35 via the driver 23, whereby the polarization direction of the laser light 3 which passes through the crystal is rotated and only the p-polarized light component is allowed to pass through the polarizing beam splitter 8 placed behind the crystal 35. Moreover, by polarizing the s-polarized light component by 90 degrees, turning ON/OFF (or pulsation) of the laser light 3 and adjustment of the output can be carried out. That is, any voltage between a voltage V1 (normally 0 V) for rotating the polarization direction of the laser light 3 so that the laser light 3 falls on the polarizing beam splitter 8 as an s-polarized light and a voltage V2 for rotating the polarization direction of the laser light 3 so that the laser light 3 is incident as a p-polarized light is applied to the Pockel's Cell (crystal) 35. In this manner, the output of the laser light output from the polarizing beam splitter 8 as a p-polarized light can be set desirably.

In FIGS. 2 and 3, separation of the p-polarized light component was explained by the use of the polarizing beam splitters 33 and 8, but various kinds of polarizing elements can be also used as substitutes for the polarizing beam splitters. Moreover, in FIG. 1, the modulator 7 and the polarizing beam splitter 8 are shown as independent parts, but in some cases, commercially available modulators (EO modulators) include various kinds of polarizing elements. Furthermore, the combinations of the Pockel's Cell and polarizing beam splitter 8 (or various kinds of polarizing elements) are sometimes collectively referred to as EO modulators.

As the modulator 7, an AO (acoustooptics) modulator can be also used as well as an EO modulator. In general, compared with an EO modulator, an AO modulator has a lower driving frequency. It also has a diffraction efficiency of 70 to 90%, which is lower than that of the EO modulator. The AO modulator, however, has a feature that it can turn ON/OFF (or pulsation) the light even when the laser light is not linearly polarized light. Therefore, it can be used even when a filter by which the polarization direction of the laser light passing therethrough is rotated is used as the continuously variable transmittance ND filter 6 or the laser light itself is not linearly polarized light. Thus, by the use of the modulator 7 such as the EO modulator 7 (and polarizing beam splitter 8) or the AO modulator, laser light having a desired waveform (time-wise energy alteration) can be obtained from the continuous-wave laser light at a desired timing. That is, desired amplitude modulation can be performed.

The laser light 3 whose amplitude is modulated by the modulator 7 passes through the beam expander (or beam reducer) 9 for adjusting its beam diameter so that its beam diameter is adjusted, and then falls on the beam shaper 11. The beam shaper 11 is an optical element for shaping the laser light 3 into a shape which is long and narrow in one direction, or a rectangular beam shape in which the long axis is extremely larger than the short axis. Normally, gas laser and solid-state laser outputs a circular beam having a Gaussian energy distribution centered around the optical axis in a plane which is perpendicular to the optical axis. Therefore, they cannot be used as they are for the laser annealing according to the present invention.

If output from the laser oscillator 4 is sufficiently large, by sufficiently expanding the beam diameter of the output laser light, and cutting out a necessary shape from a relatively uniform portion near the center thereof, a linear-shaped or rectangular beam with substantially uniform energy distribution can be obtained. This, however, results in discarding the peripheral part of the laser light, so that most of energy will be wasted. In order to convert the beam having the Gaussian distribution into a linear-shaped beam (or rectangular beam)

having a uniform distribution (top-flat) for overcoming this shortcoming, the beam shaper 11 is used.

As the beam shaper 11, a diffractive optical element can be used. The diffractive optical element is produced by forming fine stepped portions on a substrate made of quartz and the like by a photo-etching process and synthesizing diffraction patterns formed by the laser light passing through each of the stepped portions on an imaging surface so that energy distribution having a linear or rectangular shape is obtained in the plane of the mask 14 coincided consequently on the imaging surface. That is, the diffractive optical element used herein is designed and manufactured to condense a Gaussian laser light falling thereon into a beam having a uniform distribution in one direction (the long axis direction, longitudinal direction) and a Gaussian distribution in its perpendicular direction (the short axis direction, widthwise direction). When a diffractive optical element is used, a uniform distribution such that the intensity distribution in the longitudinal direction is about ±3% is obtained.

The combination of a Powell lens and a cylindrical lens can be also used as the beam shaper 11 in place of the diffractive optical element. Powell lens is a kind of cylindrical lenses. When a laser beam having a Gaussian distribution falls on the lens, an image is formed on a projection surface in such a manner that it becomes sparse in the central portion where the energy density is high in one direction and it becomes dense in peripheral portions where the energy density is low. In the direction perpendicular to that direction, Powell lens by itself does not alter the energy distribution. Therefore, the beam is condensed by a cylindrical lens. As a result, a long and narrow beam having a uniform energy distribution in the long axis direction and a Gaussian distribution in the short axis direction is formed in the plane of the mask 14. When a Powell lens is used, a uniform distribution such that the intensity distribution in the long axis direction is about ±5% is obtained.

A circumferential portion or a skirt portion (higher-order diffracted light in case of a diffractive optical element) of the beam in the long axis direction having a large change in energy density is blocked by the mask 14 in accordance with necessity or is shaped to have a necessary size. Thus, a linear-shaped laser beam having an energy distribution with a sharp leading edge and a desired size can be obtained. In place of the mask 14, a slit whose size is set variably in the long axis direction of the beam can be also used.

The linear-shaped laser beam obtained herein is converted into a collimated beam by the imaging lens 15 (tube lens), and is reductively projected on a surface of the substrate 20 by the objective lens 19 so that the size of the laser beam is reduced to the reciprocal of the magnifying power of the objective lens. That is, when a lens having magnifying power of 10 is used, the size of the laser beam is reduced to 1/10 of that of the laser beam shaped by the mask 14. The stage 21 is scanned at a high speed in the short axis direction of the linear-shaped laser light beam in a state that the laser light is irradiated, whereby the silicon film in the irradiated portion is fused and re-crystallized, and a crystalline film (strip-shaped poly-crystalline film) laterally grown in the scanning direction is obtained.

The control apparatus 29 in FIG. 1 controls the laser oscillator 4, shutter 5 and stage 21, and calculates the energy density of the laser light at the beam center from the data determined by the beam profiler 24. The control apparatus 29 also controls the transmittance of the continuously variable transmittance ND filter 6 via the driver 22 so as to correct a difference from a preliminarily set energy density (power density), and also controls a voltage applied to the crystal of the modulator 7 via the driver 23.

Figure 4A:
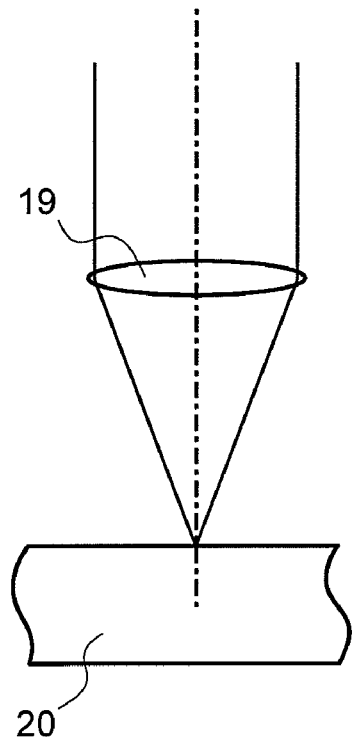
FIG. 4 is a drawing for illustrating the thermal lens effect in the objective lens in FIG. 1.

Herein, the case where laser is irradiated with the transmittance of the continuously variable transmittance ND filter 6 fixed will be described in FIG. 4. FIG. 4 is a drawing for illustrating the thermal lens effect of the objective lens in FIG. 1. In FIG. 4(a), the objective lens 19 indicates the short axis in a state that a laser light beam in the position of the mask 14 which is linear-shaped and converted into a collimated beam by the imaging lens 15 is projected on the surface of the substrate. In this state, with the substrate 20 being irradiated with the laser light, the laser light is caused to scan relative to the substrate (actually, the substrate is scanned normally). This scanning gradually causes the thermal lens effect in the objective lens 19 and deteriorates the condensed state, thereby lowering the energy density.

When the objective lens 19 is uniformly heated, the focal length is gradually reduced substantially. In this case, the influence of the thermal lens effect can be prevented by correcting the distance between the objective lens and the substrate. That is, the objective lens or the substrate may be moved in the optical axis direction to maintain the focus state at all times while the focal position is detected by the light which has passed through the objective lens.

Figure 4B:
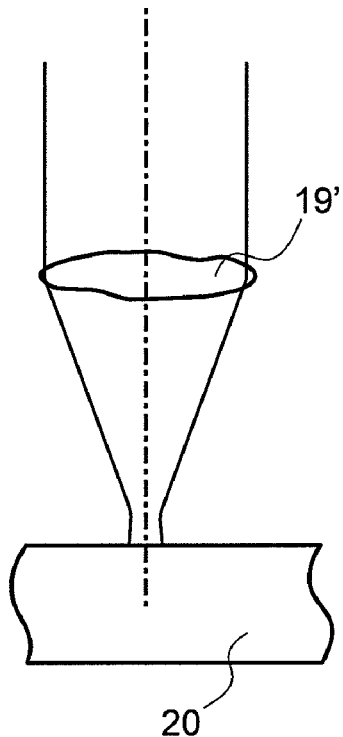
Figure 5:
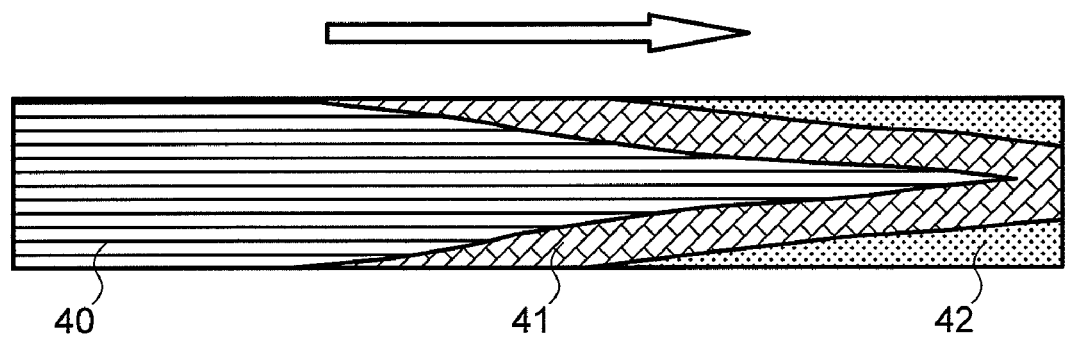
FIG. 5 is a drawing for showing the state of crystals when annealing is carried out in a state that the thermal lens effect is generated.

However, when the objective lens 19 is heated in a non-uniform manner, as shown in FIG. 4(b), the width of the short axis in the focal position of the laser light which has passed through the objective lens 19' increases, and the energy density (power density) of the laser light on the surface of the substrate gradually decreases. The results are shown in FIG. 5. FIG. 5 is a drawing for showing the status of crystals when annealing is carried out in a state that the thermal lens effect is generated. As shown in FIG. 5, initially, the strip-shaped poly-crystalline 40 is formed in the entire irradiated region in the long axis direction of the linear-shaped laser light beam, but this strip-shaped poly-crystalline region 40 becomes gradually narrow over time, and a granular poly-crystalline region 41 or a crystallite region 42 is formed therearound. Forming transistors from a silicon thin film in this granular poly-crystalline region 41 or in the region in which crystallite region 42 is formed degrades its characteristics, giving a faulty panel.

In this example, in order to prevent changes in the crystal state, the beam profile on the surface of the substrate is monitored; the width of the short axis is calculated from the determined profile; and the transmittance of the ND filter is adjusted so that a temperature rise in the laser-irradiated portion is constant or the output itself of the laser light passing therethrough is adjusted, whereby the power of the laser light irradiated on the substrate is adjusted. Detailed description according to FIG. 6 will be provided below.

Figure 6A:
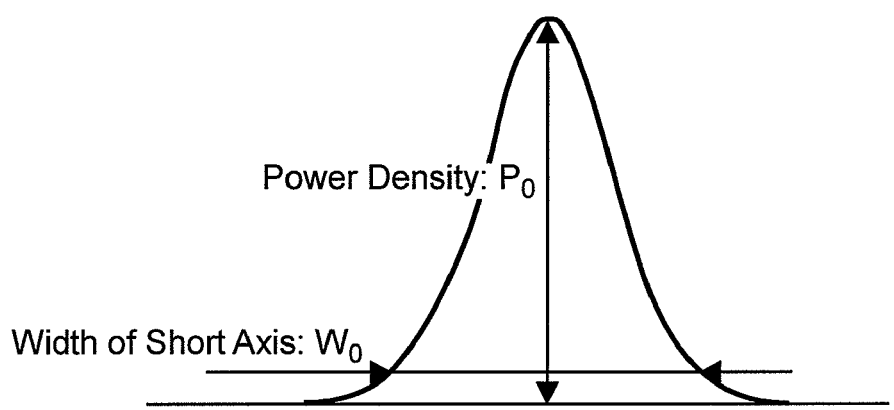
FIG. 6 is a drawing for illustrating variation in the beam profile in the short axis direction of linear-shaped laser light by the thermal lens effect.

FIG. 6 is a drawing for illustrating variation in the beam profile in the short axis direction of a linear-shaped laser light caused by the thermal lens effect. FIG. 6(a) shows the profile in the short axis direction of the beam in the initial state, that is, the state before the thermal lens effect is generated (the state shown in FIG. 4(a)). The width of the short axis is about 3 to 5 microns. Since it is similar to the pixel size in a CCD beam profiler (5 to 10 microns/pixel), it is difficult to determine the profile directly, but determination of profile is made possible by expanding a condensed beam 20 to 50 times.

For example, only several percent of the determined laser light beam is allowed to fall on the profiler 24 by the beam splitter 25. When the energy is still too high, an attenuation filter is inserted as appropriate. In this case, since the energy density is sufficiently reduced compared to that in the beam used for annealing, there is no possibility of generation of the thermal lens effect in the measurement system. Moreover, the profile in the short axis direction can be determined by expanding of the laser light beam, but the profile in the long axis direction is too large to determine (when the size in the long axis is 1 mm, if it is expanded 50 times, a region of 50 mm has to be measured). In this case, determination is performed only in a specific position, for example, a central portion of the laser light beam. From the results of this profile measurement, the power density (maximum power density) $P_0$ at the center of the beam and the width $W_0$ of the beam in the short axis direction with $1/e^2$ of the maximum power density are determined.

Figure 6B:
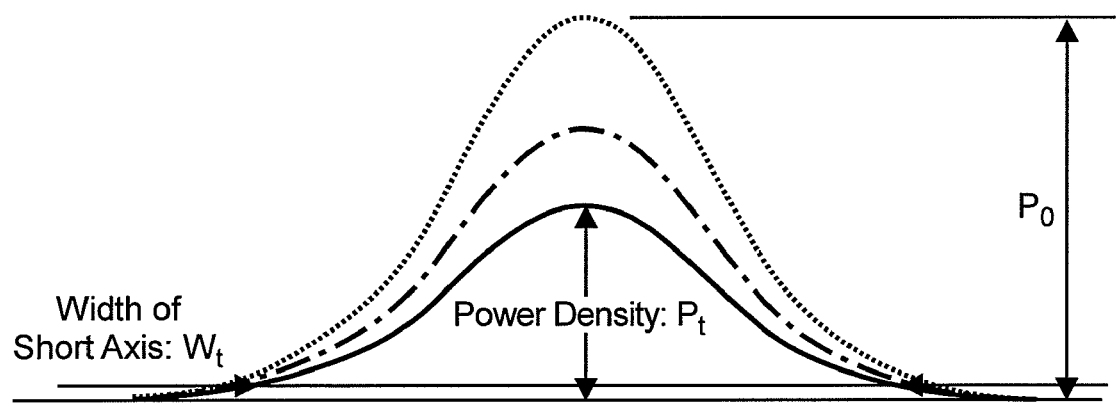

As a result of continuous irradiation of laser for a certain period, the light-concentration ability is lowered as shown in FIG. 4(b) because of the thermal lens effect of the objective lens. The results of measurement of the profile in this state are shown in FIG. 6(b) by a solid line. The power density (maximum power density) of the beam center at this time is $P_1$, and the beam width in the short axis direction with $1/e^2$ of the maximum power density is $W_1$.

Herein, if the laser output irradiating the substrate 20 is increased (actually, the output passing through is increased by increasing the transmittance of the ND filter) so that the maximum power density is adjusted to be equal to $P_0$ which is the same as in the initial state, the beam profile shown by the broken line in FIG. 6(b) is obtained. When annealing is actually performed in this state, the substrate temperature is excessively increased because of excessively high energy, thereby damaging the substrate.

For this reason, the laser output is adjusted to have such a condition that a temperature rise in a portion irradiated with the laser light becomes uniform. An increase in the temperature in the portion irradiated with the laser light is proportionate to the power density, and is also proportionate to the square root of the irradiation time. When the scanning speed is constant, the irradiation time is proportionate to the beam width in the short axis direction (scanning direction), and therefore is proportionate to the power density consequently, and to the square root of the width of the short axis. More specifically, for the profile in the short axis direction shown in FIG. 6, when a temperature rise in the irradiation portion at the start of irradiation is $T_0$ and a temperature rise at a time t is $T_t$, $T_0$ and $T_t$ can be represented by the following equations, respectively:

$$T_0 = P_0 \times \sqrt{W_0} \times A$$

$$T_t = P_t \times \sqrt{W_t} \times A$$

Herein, the maximum power density (or set maximum power density) at the start of irradiation is $P_0$; the width of the short axis is $W_0$; the maximum power density at a time t during scanning is $P_t$; and the width of the short axis is $W_t$. A is a constant.

In order to obtain a temperature rise $T_0$ with the width of the short axis $W_t$ at the time t, the maximum power density Pt may be:

$$P_t = P_0 * \sqrt{(W_t/W_0)}$$

That is, when the beam width in the scanning direction (the width of the short axis) is changed to $W_t$ because of lowered light-concentration ability, obtaining the same increased temperature as before the change is possible by irradiation with the maximum power density $P_t$ obtained by multiplying the initial maximum power density by the square root of the ratio of the expanded width to the original width $W_0$ of the short axis (=$P_0 \times \sqrt{(W_t/W_0)}$).

The width of the short axis and the maximum power density used and determined in the above description are not necessarily absolute values, and may be relative values.

Herein, when the power at the start of irradiation is $E_0$ and the irradiation power at a time t is $E_t$ since the maximum power density is proportionate to the irradiation power, the irradiation power $E_t$ may be adjusted so that the following equation is satisfied:

$$E_t = E_0 \times \sqrt{(W_t/W_0)}$$

FIG. 7 is a drawing for showing the relationship between the irradiation power and the size of the short axis of the laser light and of an increased temperature in an irradiated portion on the substrate in a manufacturing method of a flat display device, which is an example of the present invention. In FIG. 7(a) to FIG. 7(e), the horizontal axis indicates a position on the substrate (referred to as the substrate position in the Figs.). The vertical axis indicates the irradiation power (relative value) in FIG. 7(a); the width of the short axis (relative value) in FIG. 7(b); an increased temperature (relative value) in the irradiated portion of the substrate when no correction is performed in FIG. 7(c); the irradiation power (relative value) of the laser light after correction in FIG. 7(d); and an increased temperature (relative value) in the irradiated portion of the substrate after correction in FIG. 7(e).

Figure 7A:
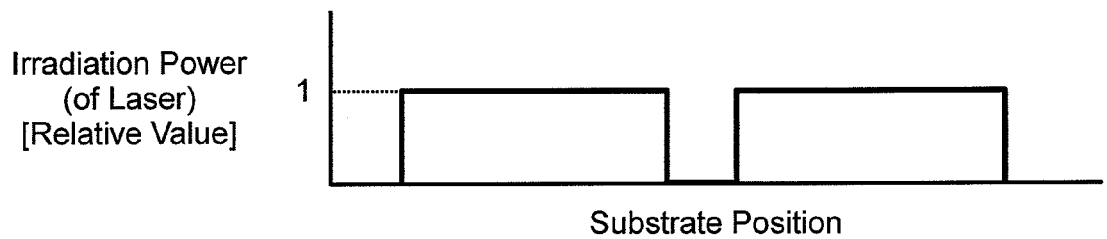
FIG. 7 is a drawing for showing the relationship among the irradiation power and size of the short axis of the laser light and an increased temperature in an irradiated portion on the substrate in a manufacturing method of a flat display device, which is an example of the present invention.
Figure 7B:
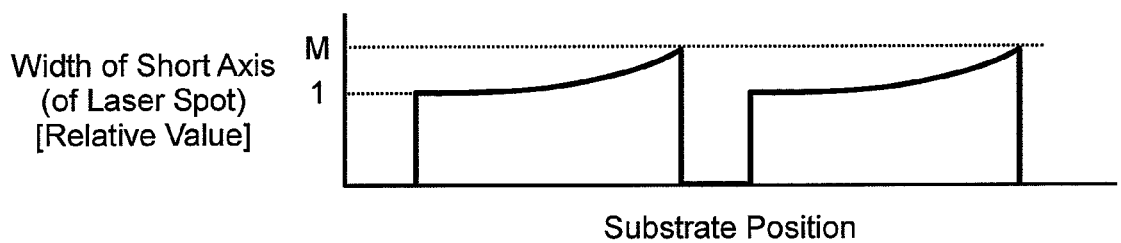
Figure 7C:
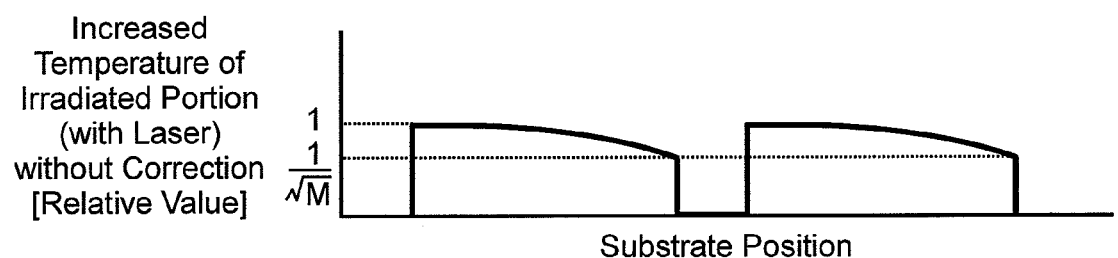

As shown in FIG. 7(a), when annealing is performed by repeating ON/OFF control of laser light irradiation with a constant power, the width of the short axis of the laser light formed linearly by the thermal lens effect gradually expands as shown in FIG. 7(b), and expands M times at a point when irradiation of one-panel portion is completed. As a result, the increased temperature in the portion irradiated with the laser light falls to $1/\sqrt{M}$ of the value at the start of irradiation as shown in FIG. 7(c). The thermal lens effect is resolved or mitigated as the laser light is turned into the OFF state, and the thermal lens effect appears as the laser light is turned into the ON state again.

Figure 7D:
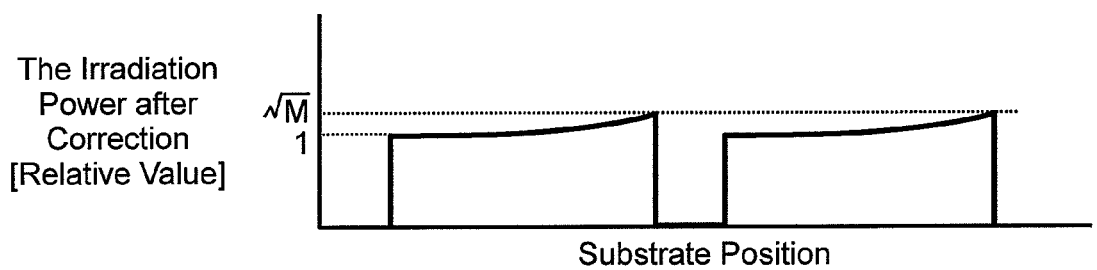
Figure 7E:
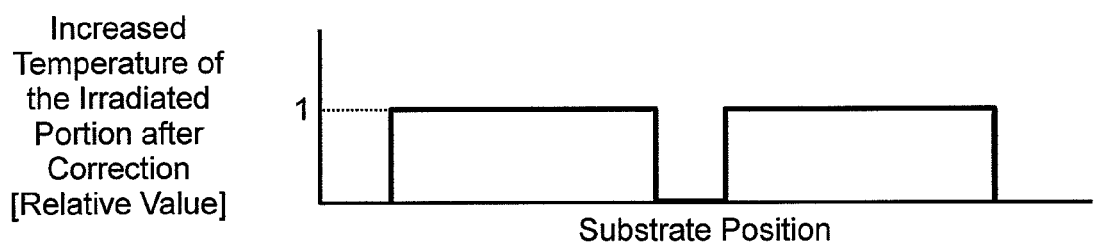

Thus, as shown in FIG. 7(d), the size of the short axis is monitored at all time and calculated at regular time intervals, and the irradiation power is increased to the square root of the ratio of the expanded width of the short axis to the width of the short axis at the start of irradiation, that is, when the width of the short axis is expanded M times, the power is increased $\sqrt{M}$ times the power at the start of irradiation. Because of this adjustment, the increased temperature in the laser irradiated portion is maintained constantly at all times as shown in FIG. 7(e), and the obtained crystal is also maintained constantly.

To realize this, annealing may be started by using the ND filter 6 normally with a transmittance of about 50 to 70%, and the transmittance of the ND filter 6 may be increased as the thermal lens effect is generated. Alternatively, adjustment of the power density can be also performed by the EO modulator (EOM). More specifically, the voltage applied to the EOM may be set so that the power which is allowed to pass through is about 50 to 70% of the maximum transmission power, and the power which is allowed to pass through may be controlled so as to be increased as the thermal lens effect is generated after annealing is started.

Although in the above description, the beam width in the short axis direction of the laser light is defined as $1/e^2$, a similar result is obtained even if it is calculated as the full width at half maximum (HMFW).

Figure 8:
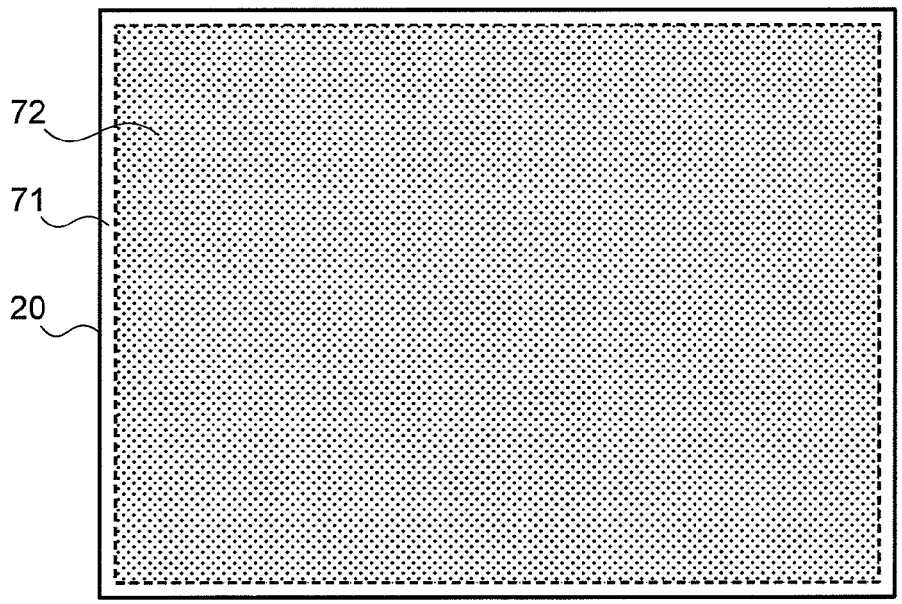
FIG. 8 is a plan view for showing a substrate which is an object of an example of the manufacturing method of a flat display device of the present invention.
Figure 9:
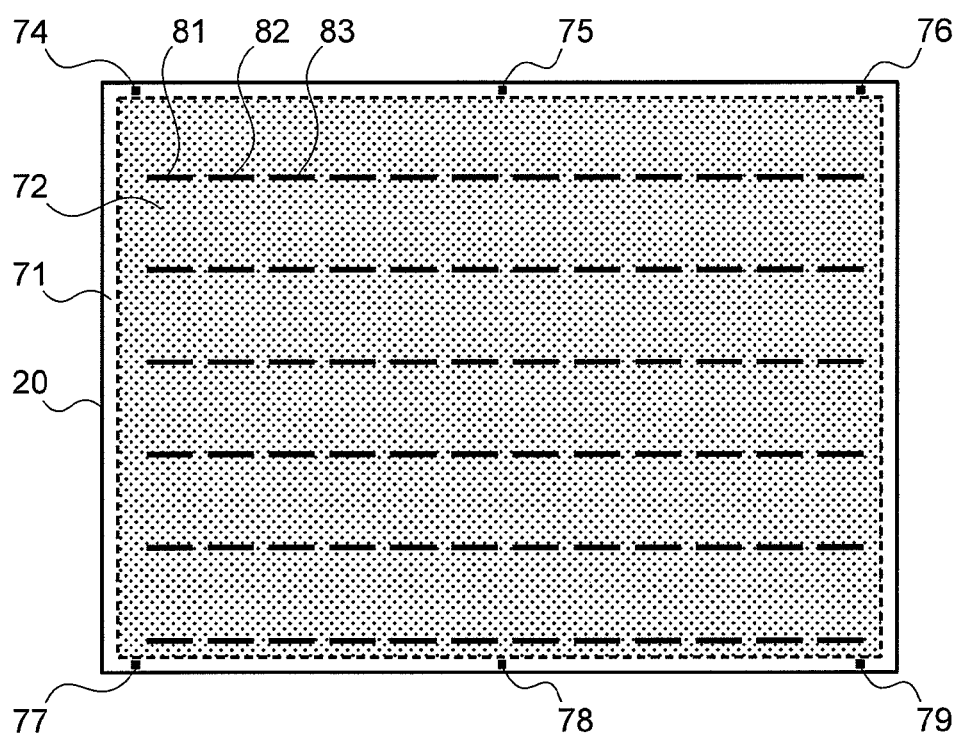
FIG. 9 is a drawing for showing the state of the substrate after alignment marks are formed and peripheral circuit portions concentratedly provided on one side of each of the panel are converted into a strip-shaped poly-crystalline film in an example of the manufacturing method of a flat display device of the present invention.
Figure 10:
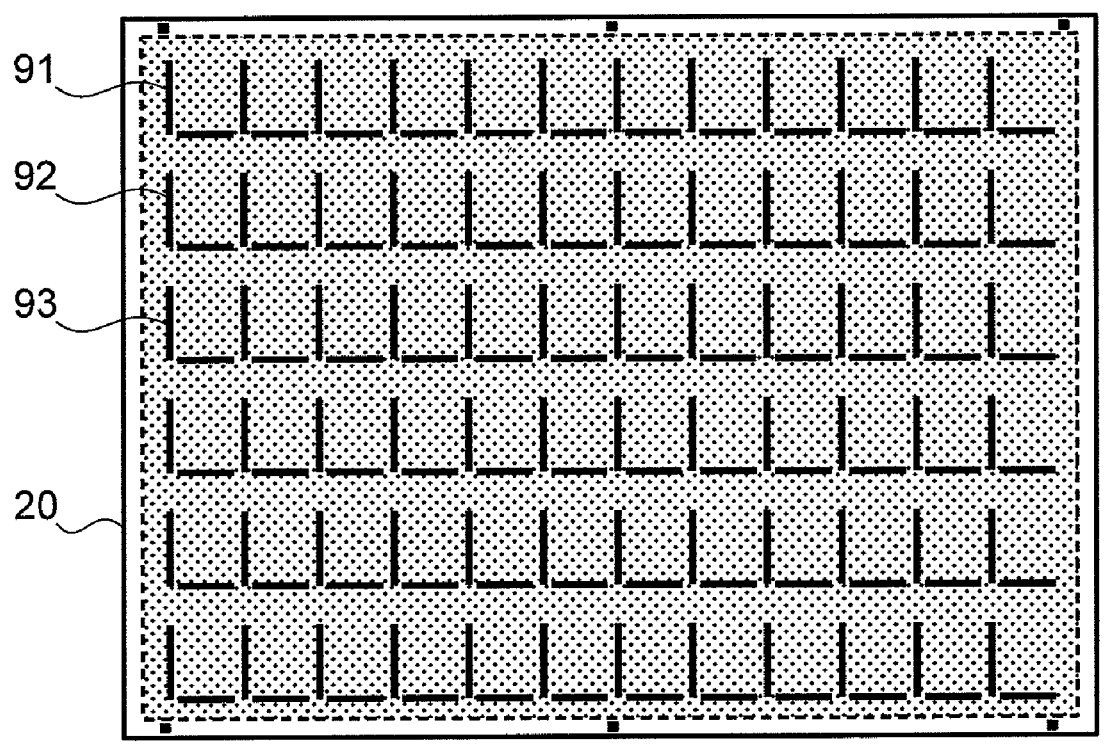
FIG. 10 is a drawing for showing the state of the substrate after the peripheral circuit portions formed on two sides of each panel are converted into a strip-shaped poly-crystalline film in an example of the manufacturing method of a flat display device of the present invention each.

An example of the manufacturing method of a flat display device using the manufacturing device whose constitution is shown in FIG. 1 will be described in detail below with reference to FIGS. 8, 9 and 10. FIG. 8 is a plan view for showing a substrate to be processed by an example of the manufacturing method of a flat display device of the present invention. FIG. 9 is a drawing for showing the status of the substrate after alignment marks are formed and peripheral circuit portions concentratedly provided on one side of each panel are converted into a strip-shaped poly-crystalline film in an example of the manufacturing method of a flat display device of the present invention. FIG. 10 is a drawing for showing the status of the substrate after the peripheral circuit portions formed on two sides of each panel are converted into a strip-shaped poly-crystalline film in an example of the manufacturing method of a flat display device of the present invention.

On the substrate 20 which is to be processed herein, an amorphous silicon film is formed with an insulating film, comprising a $SiO_2$ film and/or SiN film, interposed therebetween on a transparent substrate such as glass. The substrate 20 is entirely annealed except for its peripheral portions in a state that a measure is preliminarily taken so that the peripheral portions sizing about 5 to 20 mm in width are prevented from being irradiated with laser by the excimer laser annealing device. Normally, the excimer laser beam is shaped into a rectangular shape with a width of several hundred microns and a length of several hundred millimeters, and scanning and irradiation are performed simultaneously under the condition that one portion is irradiated with 5 to 30 pulses of the beam. As a result, the amorphous silicon film 71 in the peripheral portions of the substrate are left as it is as shown in FIG. 8, and the portions other than the peripheral portions are melted and re-crystallized by irradiation of the excimer laser to be then converted into a granular poly-crystalline silicon film 72. This poly-crystalline silicon film 72 is a granular crystal having crystal particle sizes of several ten to several hundred nanometers, The obtained mobility of the TFT formed of this film is about 100 $cm^2/Vs$, which is sufficient performance to be used as a TFT for switching pixels.

Subsequently, the substrate 20 which has been converted into a granular poly-crystal except for the peripheral portions is transported to the apparatus shown in FIG. 1 and is processed. The substrate 20 is mounted on the stage 21 in FIG. 1. In order to perform rough positioning, the substrate 20 is pushed against a plurality of pins (not shown) placed on the stage 21 to thereby perform pre-alignment. In such a manner, alignment of about ±100 microns can be performed. Description will be provided below with reference to drawings.

After the rough alignment is performed, a portion where the amorphous silicon film 71 is remaining in the peripheral portion of the substrate is irradiated with laser light in the form of projecting a mask pattern for alignment marks to form alignment marks 74 to 79. At this time, although omitted in FIG. 1, the beam shaper 11 is replaced by a beam shaper which can obtain a uniform rectangular or circular distribution, and the mask 14 is also replaced by a mask on which alignment marks are formed. In general, alignment marks to be formed size from several ten microns per side to a few hundred microns per side, and a mask pattern is reductively projected on the substrate 20 by irradiating with laser light a mask (not shown) on which an alignment mark pattern is formed.

The laser used may be continuous-wave laser for performing annealing (formation of strip-shaped poly-crystalline film), or may be small pulse laser installed for forming marks. Accordingly, the laser light which passes through the mask is radiated on the amorphous silicon film, and only the irradiated portion is converted into a poly-crystalline silicon film. This poly-crystalline film is not necessarily be a laterally grown crystal, and may be a granular poly-crystalline or a so-called fine crystal. Whichever poly-crystalline state the irradiated portions are in, their reflectance is different from that of the amorphous silicon film of the non-laser-irradiated portion, and therefore they can be used as alignment marks.

After a first alignment mark is formed, the stage 21 is moved and stopped at a position of a second alignment mark, and the laser light is radiated again to form an alignment mark. This procedure is repeated as many times as necessary, thereby sequentially forming the alignment marks 74 to 79 in necessary portions. In such a manner, as shown in FIG. 9, the alignment marks 74, 75, 76 and alignment marks 77, 78, 79 and the like are formed in the amorphous silicon film portion 71 remaining in the peripheral portion of the substrate 20.

In FIG. 9, the case where the six alignment marks 74 to 79 are formed in the substrate 20 as an example, but the number of the alignment marks is not limited to this number. Moreover, the shape of the alignment marks can be selected from various shapes as necessary. When annealing (formation of strip-shaped poly-crystalline film) is performed in two (lengthwise and crosswise) directions, these alignment marks are used for aligning a photo mask (or reticle) in the photoresist process carried out firstly after the annealing process after the substrate 20 is rotated by 90 degrees. When exposure is performed by a stepper, as many alignment marks as the number of the panels formed inside the substrate may be formed, or an alignment mark may formed only in a position corresponding to the first panel so that the rest of the panels are exposed by using the movement accuracy of the stepper. In case of an aligner which exposes the entire surface at one time, it suffices to form alignment marks in two or three portions.

Subsequently, a portion in each panel where peripheral circuits including driver circuits are formed is irradiated with linear-shaped continuous-wave laser light while scanning in its short axis direction, and a part of the portion 72 converted into the poly-crystalline silicon film by excimer laser annealing is converted into a strip-shaped poly-crystalline film grown in the transverse direction (laterally). Accordingly, as shown in FIG. 9, the driver circuit portions 81, 82, 83 and other portions (indicated by thick solid lines as driver circuit portions in FIG. 9) are all converted into strip-shaped poly-crystalline films.

At this time, by the influence of the laser light passing through the objective lens 19 from the start of irradiation, the width of the short axis gradually increases also in a single driver circuit portion (for example, 81) because of the thermal lens effect of the objective lens 19. As described earlier, the profile of the laser light beam is monitored, and the transmittance of the ND filter is increased in response to a change in the detected width of the short axis so that the power is such a value that is obtained by multiplying the square root of the change. Therefore, a strip-shaped poly-crystalline film laterally grown in the scanning direction of the laser light can be formed uniformly throughout the width of the radiated laser light in the long axis direction.

Alternatively, the beam width (the width of the short axis) W(t) in the scanning direction from the point of the start of the laser light irradiation may be determined in advance, and the transmittance of the ND filter may be increased so that irradiation power $E(=E_0 \times \sqrt{(W(t)/W_0)}$, which is obtained by multiplying the square root of the change in the width of the laser light beam, is attained, in response to a lapse of time from the start of irradiation (herein, $E_0$ and $W_0$ are the laser output at the start of irradiation and the width of the short axis, respectively). When small panels are the objects, the laser light is in the OFF state only for a short period of time between panels, but the width of the short axis may not be returned to the initial state in some cases. In this case, a change in the width of the short axis equivalent to one scanning operation, including the period during which the laser light is in the OFF state, is determined in advance.

In FIG. 9, the case where 72 (12×6) panels are formed in the substrate is shown. When regions in which peripheral circuits including driver circuits are formed are concentrated on one side of the panels, only annealing by scanning the substrate in one direction is required. The peripheral circuit portions including driver circuits of all the panels produced in the substrate are irradiated with laser light, and those portions are converted into strip-shaped poly-crystalline films, whereby the process is completed. Normally, the peripheral circuit portions including driver circuits have the length approximately equivalent to the size of one panel size, and the width of about 500 to 3000 microns (0.5 to 3 mm). When the dimension of the beam in the longitudinal direction is less than that of the peripheral circuit portion, it is formed by scanning a plurality of times.

When the peripheral circuits including driver circuits are formed on two sides of the panels, it is necessary to rotate the substrate by 90 degrees and scan in the same direction as before it is rotated, or to rotate the longitudinal direction of the linear-shaped laser light and the transverse direction by 90 degrees and scan perpendicularly to the direction before the rotation. In these cases, in particular when the substrate is rotated, even if the substrate is pushed against the thrusting pins, the position accuracy of the rotational center of the substrate is ensured only about ±100 microns. Therefore, accurate alignment is necessary before laser light irradiation. For this reason, the alignment marks formed initially are detected in a plurality of portions, if necessary, and the substrate is aligned with respective to the detected coordinates. Scanning by irradiation of the linear-shaped laser light is performed as in the procedure shown in FIG. 9 after the alignment, whereby strip-shaped poly-crystalline film regions 91, 92, 93 and others which are laterally grown in the direction perpendicular to the previous direction can be formed as shown in FIG. 10.

When processing of the first substrate is completed, the substrate 20 is unloaded from the stage 21 and contained in a cassette (not shown). Simultaneously, a second substrate is mounted on the stage 21 and processing of the second substrate is started. When processing of all the substrates contained in the cassette is completed, the cassette is transferred for the next process, and finally the flat display device is formed.

The above description describes a manufacturing method for the case where an amorphous silicon thin film formed on the substrate is converted into a granular poly-crystalline silicon film by excimer laser irradiation, and then only the regions in which driver circuits are formed are converted into strip-shaped poly-crystalline silicon films, but only the regions in which the driver circuits are formed directly from the amorphous silicon thin film can be converted into strip-shaped poly-crystalline silicon films. In such a case, the switching circuits of the pixels are constituted of transistors formed of amorphous silicon (a-Si) thin films.

As already described, the manufacturing method of a flat display device of the present invention forms a strip-shaped poly-crystalline silicon film by scanning and irradiating only a region in which peripheral circuits including driver circuits are formed on an amorphous silicon thin film or a granular poly-crystalline silicon thin film formed by irradiating excimer laser with continuous-wave laser light (or, quasi-continuous-wave laser light) condensed into a linear shape at a high speed. At this time, irradiation is performed in such a manner that the thermal lens effect generated by condensing high-output laser light with an objective lens, that is, a change in a temperature rise caused by a change in the profile of the laser light condensed by the objective lens is corrected so that an appropriate temperature rise is obtained at all times, whereby changes in the quality of the strip-shaped poly-crystalline film can be suppressed. Accordingly, the yield in manufacturing flat display devices can be improved and their qualities can be ensured.

The manufacturing method of a flat display device of the present invention can be applied to the manufacture of flat display devices such as liquid crystal display devices and organic EL displays.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A manufacturing method of a flat display device for obtaining an active matrix substrate for use in a display device by placing a substrate with an amorphous semiconductor film or a granular poly-crystalline semiconductor film formed on the main surface thereof on a stage, and irradiating and annealing a plurality of regions of the amorphous semiconductor film or granular poly-crystalline semiconductor film on the substrate with a laser light shaped into a long and narrow beam while scanning the regions in a direction crossing the long axis direction of the shaped long and narrow laser beam to reform the amorphous semiconductor film or the granular poly-crystalline semiconductor film into a band-like poly-crystalline semiconductor film, the method comprising:

monitoring a beam profile of the laser light on the substrate, calculating a maximum power density and a width of the short axis of the beam in the scanning direction from the monitored beam profile, and scanning and irradiating with the laser light at a constant speed while adjusting laser output based on the calculated maximum power density and the width of the short axis of the beam.

2. A manufacturing method of a flat display device according to claim 1, wherein the laser light is continuous-wave laser light or quasi-continuous-wave laser light, and in adjusting laser output of the radiated laser, the width of the short axis of the beam in the scanning direction is calculated at regular time intervals from the beam profile on the substrate while scanning with the laser light at a constant speed, and the laser output is adjusted to a value obtained by multiplying laser output set at the start of irradiation or in advance by the square root of a ratio of the calculated beam width of the short axis to the width of the short axis set at the start of irradiation or in advance.

3. A manufacturing method of a flat display device according to claim 2, wherein adjustment of the laser output is performed by a continuously variable transmittance filter comprising a ½ wave plate and a polarizing beam splitter.

4. A manufacturing method of a flat display device according to claim 2, wherein adjustment of the laser output is carried out by adjusting a voltage applied to an EO modulator for performing amplitude modulation of the laser light.

5. A manufacturing method of a flat display device according to claim 1, wherein the laser light is continuous-wave laser light or quasi-continuous-wave laser light, and in adjusting laser output of the radiated laser $E_t$, a beam width (the width of the short axis) $W_t$ in the scanning direction is calculated at regular time intervals from the beam profile on the insulating substrate while scanning with the laser light at a constant speed, a laser output $E_t$ is adjusted to a value obtained by multiplying a laser output $E_0$ set at the start of irradiation or in advance by the square root of a ratio of the calculated beam width $W_t$ of the short axis to the width $W_0$ of the short axis set at the start of irradiation or in advance $(E_t=E_0\times\sqrt{(W_t/W_0)})$.

6. A manufacturing method of a flat display device according to claim 5, wherein adjustment of the laser output is performed by a continuously variable transmittance filter comprising a ½ wave plate and a polarizing beam splitter.

7. A manufacturing method of a flat display device according to claim 5, wherein adjustment of the laser output is carried out by adjusting a voltage applied to an EO modulator for performing amplitude modulation of the laser light.

8. A manufacturing method of a flat display device according to claim 1, wherein the laser light is continuous-wave laser light or quasi-continuous-wave laser light, and in adjusting laser output of the radiated laser the beam width (the width of the short axis) W(t) of the laser light in the scanning direction on the substrate when scanning the insulating substrate at a constant speed is determined in advance, and a radiated laser output E(t) is adjusted to a value obtained by multiplying the laser output $E_0$ set at the start of irradiation or in advance by the square root of a ratio of the width W(t) of the short axis determined in advance to the width $W_0$ of the short axis set at the start of irradiation or in advance, $(E(t)=E_0\times\sqrt{(W_t/W_0)})$.

9. A manufacturing method of a flat display device according to claim 8, wherein adjustment of the laser output is performed by a continuously variable transmittance filter comprising a ½ wave plate and a polarizing beam splitter.

10. A manufacturing method of a flat display device according to claim 8, wherein adjustment of the laser output is carried out by adjusting a voltage applied to an EO modulator for performing amplitude modulation of the laser light.

11. A manufacturing method of a flat display device according to claim 1, wherein scanning and irradiating with the laser light at a constant speed of the substrate is performed while adjusting laser output based on the calculated maximum power density and width of the short axis of the beam so that the temperature rise in a laser irradiated portion becomes constant.

* * * * *